(12) United States Patent
Liu et al.

(10) Patent No.: US 11,375,642 B2
(45) Date of Patent: Jun. 28, 2022

(54) ELECTRONIC POWER MODULE ASSEMBLIES AND CONTROL LOGIC WITH DIRECT-COOLING VAPOR CHAMBER SYSTEMS

(71) Applicant: GM GLOBAL TECHNOLOGY OPERATIONS LLC, Detroit, MI (US)

(72) Inventors: Ming Liu, Shanghai (CN); Anthony M. Coppola, Rochester Hills, MI (US); Kestutis A. Sonta, Troy, MI (US)

(73) Assignee: GM Global Technology Operations LLC, Detroit, MI (US)

(*) Notice: Subject to any disclaimer, the term of this patent is extended or adjusted under 35 U.S.C. 154(b) by 405 days.

(21) Appl. No.: 16/724,998

(22) Filed: Dec. 23, 2019

(65) Prior Publication Data
US 2021/0195808 A1    Jun. 24, 2021

(51) Int. Cl.
| | |
|---|---|
| *G06F 1/16* | (2006.01) |
| *H05K 5/00* | (2006.01) |
| *H05K 7/00* | (2006.01) |
| *H05K 7/20* | (2006.01) |
| *B60L 50/51* | (2019.01) |
| *B60L 50/60* | (2019.01) |

(52) U.S. Cl.
CPC .......... *H05K 7/20881* (2013.01); *B60L 50/51* (2019.02); *B60L 50/60* (2019.02); *H05K 7/20327* (2013.01); *H05K 7/20936* (2013.01); *B60L 2210/40* (2013.01)

(58) Field of Classification Search
CPC .......... H05K 7/20881; H05K 7/20327; H05K 7/20936; H05K 7/20927; H05K 7/2089; H05K 7/2029; H05K 7/20872; H05K 7/20845; B60L 50/51; B60L 50/60; B60L 50/52; B60L 50/61; B60L 50/62
See application file for complete search history.

(56) References Cited

U.S. PATENT DOCUMENTS

| | | | |
|---|---|---|---|
| 6,103,075 | A | 8/2000 | Winsel et al. |
| 6,639,385 | B2 | 10/2003 | Verbrugge et al. |
| 6,641,942 | B1 | 11/2003 | Rouillard et al. |
| 7,109,685 | B2 | 9/2006 | Tate, Jr. et al. |
| 7,324,902 | B2 | 1/2008 | Verbrugge et al. |

(Continued)

*Primary Examiner* — Anthony M Haughton
(74) *Attorney, Agent, or Firm* — Quinn IP Law

(57) ABSTRACT

Presented are electronic power module assemblies with direct-cooling vapor chamber systems, methods for making/using such power module assemblies, and vehicles equipped with such power module assemblies. A power module assembly includes an outer housing with an internal coolant chamber that circulates therethrough a coolant fluid. A power semiconductor switching device is mounted to the module's housing, separated from the coolant chamber and isolated from the coolant fluid. The power device selectively modifies electric current transmitted between a power source and an electrical load. A two-phase, heat-spreading vapor chamber device includes an outer casing with a casing segment that is mounted to the module housing, fluidly sealed to the internal coolant chamber and exposed to the coolant fluid. Another casing segment includes an inboard-facing casing surface that is mounted to an outboard-facing surface of the power device, and an outboard-facing casing surface mounted to an inboard-facing surface of the power device.

20 Claims, 5 Drawing Sheets

(56) References Cited

U.S. PATENT DOCUMENTS

| | | |
|---|---|---|
| 7,373,264 B2 | 5/2008 | Verbrugge et al. |
| 7,612,532 B2 | 11/2009 | Verbrugge |
| 7,768,233 B2 | 8/2010 | Lin et al. |
| 7,928,690 B2 | 4/2011 | Koch et al. |
| 8,035,986 B2 | 10/2011 | Koetting et al. |
| 8,054,046 B2 | 11/2011 | Lin et al. |
| 8,059,404 B2 | 11/2011 | Miller et al. |
| 8,108,160 B2 | 1/2012 | Liu et al. |
| 8,170,818 B2 | 5/2012 | Lin et al. |
| 8,198,864 B2 | 6/2012 | Koch et al. |
| 8,212,519 B2 | 7/2012 | Koch et al. |
| 8,321,164 B2 | 11/2012 | Liu et al. |
| 8,581,543 B2 | 11/2013 | Koch et al. |
| 8,645,088 B2 | 2/2014 | Schaefer et al. |
| 8,836,280 B2 | 9/2014 | Koch et al. |
| 9,172,118 B2 | 10/2015 | Marsh et al. |
| 9,176,194 B2 | 11/2015 | Meisner et al. |
| 9,178,192 B2 | 11/2015 | Payne |
| 9,337,484 B2 | 5/2016 | Verbrugge et al. |
| 9,354,277 B2 | 5/2016 | Lin et al. |
| 9,461,490 B2 | 10/2016 | Ying |
| 9,513,338 B2 | 12/2016 | Koch et al. |
| 10,744,682 B2 * | 8/2020 | Ellison ................. B33Y 40/00 |
| 11,207,982 B2 * | 12/2021 | Liu ...................... B60L 50/64 |
| 2011/0309838 A1 | 12/2011 | Lin et al. |
| 2014/0297084 A1 | 10/2014 | Meisner et al. |
| 2014/0363712 A1 * | 12/2014 | Wohrle ............... H01M 50/222 |
| | | 429/94 |
| 2015/0017508 A1 | 1/2015 | Khakhalev |
| 2015/0162571 A1 | 6/2015 | Ogg et al. |
| 2015/0301116 A1 | 10/2015 | Baker et al. |
| 2015/0318502 A1 | 11/2015 | Kanai |
| 2016/0039419 A1 | 2/2016 | Wampler et al. |
| 2016/0077160 A1 | 3/2016 | Wampler, II et al. |
| 2016/0254562 A1 | 9/2016 | Morris-Cohen et al. |
| 2016/0259011 A1 | 9/2016 | Joe |
| 2016/0293991 A1 | 10/2016 | Goeltz et al. |
| 2016/0336552 A1 | 11/2016 | MacLean et al. |
| 2016/0372777 A1 | 12/2016 | Buckley et al. |
| 2017/0077507 A1 | 3/2017 | Harada et al. |
| 2018/0375132 A1 | 12/2018 | Li et al. |
| 2019/0126770 A1 | 5/2019 | Koch et al. |
| 2019/0157710 A1 | 5/2019 | Makino et al. |
| 2019/0357386 A1 * | 11/2019 | Coppola ............. B29C 45/0055 |
| 2021/0043389 A1 * | 2/2021 | Coppola ............. H01G 9/0003 |
| 2021/0178902 A1 * | 6/2021 | Liu ...................... B60L 50/64 |

\* cited by examiner

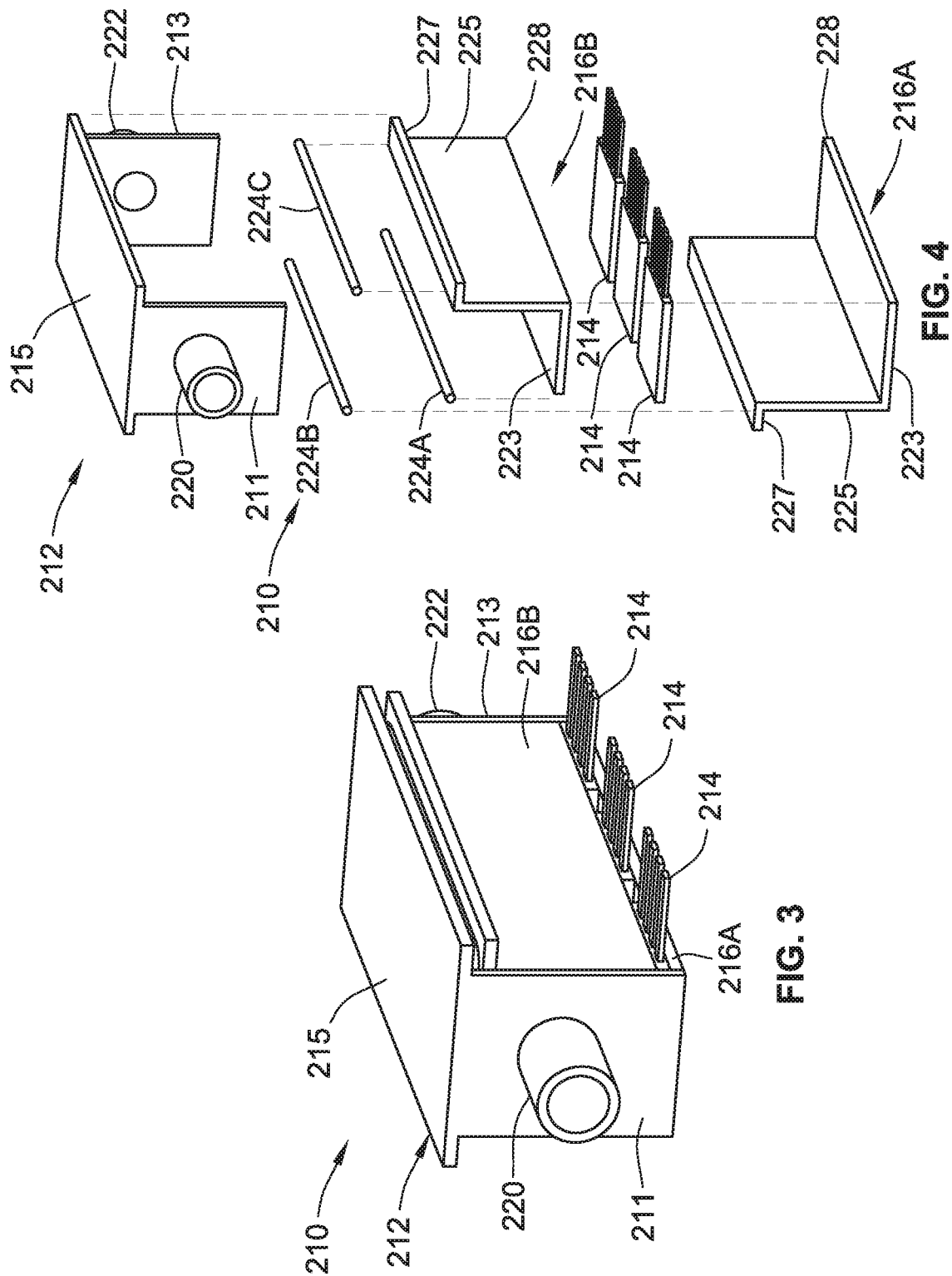

ELECTRONIC POWER MODULE ASSEMBLIES AND CONTROL LOGIC WITH DIRECT-COOLING VAPOR CHAMBER SYSTEMS

INTRODUCTION

The present disclosure relates generally to high-voltage electrical power systems. More specifically, aspects of this disclosure relate to thermal management systems for traction power inverter modules (TPIM) of electrified vehicle powertrains.

Current production motor vehicles, such as the modern-day automobile, are originally equipped with a powertrain that operates to propel the vehicle and power the vehicle's onboard electronics. In automotive applications, for example, the vehicle powertrain is generally typified by a prime mover that delivers driving power through an automatic or manually shifted power transmission to the vehicle's final drive system (e.g., differential, axle shafts, road wheels, etc.). Automobiles have historically been powered by a reciprocating-piston type internal combustion engine (ICE) assembly due to its ready availability and relatively inexpensive cost, light weight, and overall efficiency. Such engines include compression-ignited (CI) diesel engines, spark-ignited (SI) gasoline engines, two, four, and six-stroke architectures, and rotary engines, as some non-limiting examples. Hybrid electric and full electric ("electric-drive") vehicles, on the other hand, utilize alternative power sources to propel the vehicle and, thus, minimize or eliminate reliance on a fossil-fuel based engine for tractive power.

A full electric vehicle (FEV)—colloquially branded as an "electric car"—is a type of electric-drive vehicle configuration that altogether removes the internal combustion engine and attendant peripheral components from the powertrain system, relying solely on electric traction motors for propulsion and for supporting accessory loads. The engine assembly, fuel supply system, and exhaust system of an ICE-based vehicle are replaced with a single or multiple traction motors, a traction battery back, and battery cooling and charging hardware in an FEV. Hybrid electric vehicle (HEV) powertrains, in contrast, employ multiple sources of tractive power to propel the vehicle, most commonly operating an internal combustion engine assembly in conjunction with a battery-powered or fuel-cell-powered electric traction motor. Since hybrid-type, electric-drive vehicles are able to derive their power from sources other than the engine, hybrid electric vehicle engines may be turned off, in whole or in part, while the vehicle is propelled by the electric motor(s).

High-voltage (HV) electrical systems govern the transfer of electricity between each traction motor and a rechargeable traction battery pack (also referred to as "electric-vehicle battery" or "EVB") that stores and supplies the requisite power for operating many hybrid and full-electric powertrains. HV electric systems may employ a front-end DC-to-DC power converter that is electrically connected to the vehicle's traction battery pack(s) in order to increase the supply of voltage to a high-voltage main direct current (DC) bus and an electronic power inverter module (PIM). A high-frequency bulk capacitor may be arranged across the positive and negative terminals of the main DC bus to provide electrical stability and store supplemental electrical energy. Bulk capacitor size—in terms of total capacitance—may be selected to achieve desired DC bus voltage range, peak current, and ripple voltage when operating the inverter employing, for example, a six-step mode of operation. Operation and control of multi-phase electric motor/generator units, such as permanent magnet synchronous traction motors, may be accomplished by employing the inverter to transform DC electric power to alternating current (AC) power using pulse-width modulated control signals output from a resident vehicle controller.

Various multi-speed power transmission architectures have been developed for selectively transmitting rotational power from the vehicle's prime mover to the final drive system. An available type of power transmission is the electrically variable electric drive unit (EDU) that contains an electric motor/generator unit, epicyclic gear train elements, clutches, power electronics and, optionally, differential and axle components. The clutches govern engagement/disengagement of the gear train elements to provide for electrically variable modes, fixed speed ratio modes, and electric-only ("battery power") modes of operation. The electronic PIM assembly is utilized to control operation of the EDU's motor/generator unit(s). Generally, the power inverter, DC-to-DC power converter, and other requisite power electronic modules are assembled remote from and subsequently mounted to the EDU. Assembly of the individual power electronic modules to the EDU may necessitate dedicated mounting hardware, electrical connectors, sealing gaskets, and housing containers to secure each module to the EDU. In order to regulate the operating temperatures of the individual power electronic modules, the EDU employs a fluid pump and dedicated plumbing to route coolant fluid into each module's discrete housing.

SUMMARY

Presented herein are electronic power module assemblies with direct-cooling vapor chamber systems, torque-transmitting powertrains utilizing such power module assemblies, methods for making and methods for using such power module assemblies, and motor vehicles equipped with such power module assemblies. By way of example, there are presented power module packaging designs that employ multiple two-phase, heat-spreading vapor chambers for thermal management of the module's individual power devices. The power module assembly's power devices may be in the nature of power semiconductor switching devices that are sandwiched between opposing interior faces of a power module bracket housing. Fluidly sealed inside the bracket housing is a coolant chamber through which circulates a coolant fluid; the power devices are fluidly isolated from this coolant fluid. Discrete vapor chambers are mounted to inboard and outboard-facing surfaces of each power device, thermodynamically connecting these surfaces with the internal coolant chamber of the bracket housing. In this manner, the vapor chambers transfer device-generated heat to the coolant chamber to achieve double-sided direct cooling for the power devices. The vapor chamber devices may each be constructed as a self-contained unit with a fluid-tight casing having a generally L-shaped or U-shaped transverse cross-section. Each vapor chamber may extend the entire length of a housing sidewall or, alternatively, may define one or more of the bracket housing's walls. Polymeric seal strips may be used to fluidly seal crimped interfaces between the vapor chambers' casings and/or between the casings and the bracket housing's wall(s).

Attendant benefits for at least some of the disclosed concepts may include novel power module packaging designs that provide efficient direct cooling to opposing sides of each power device for optimized thermal management. In so doing, disclosed power module designs concomitantly increase the power density and operational life expectancy of the HV electrical system. Disclosed direct-cooling vapor chamber systems enable the power module to use high-voltage insulated gate bipolar transistors (IGBT) and wideband gap (WBG) devices, which in turn helps to improve powertrain performance. Other attendant benefits may include power module architectures that help to minimize electrical system complexity and associated costs while reducing gross vehicle weight and providing a more efficient powertrain system with improved vehicle range and fuel economy.

Aspects of this disclosure are directed to electronic power module assemblies with direct-cooling vapor chamber systems for optimized power device thermal management. In an example, a power module assembly is presented for controlling the transfer of electrical power back-and-forth between a power source (e.g., one or more rechargeable battery packs) and an electrical load (e.g., one or more electric motors). The power module assembly includes a protective outer housing with an internal coolant chamber that circulates therethrough a coolant fluid. One or more power devices (e.g., semiconductor switching devices) are mounted at least partially inside of the module housing, physically separated from the internal coolant chamber and fluidly isolated from the coolant fluid. Each power device is selectively operable to modify electric current transmitted between the power source and electrical load. The power module assembly also includes one or more two-phase, heat-spreading vapor chamber devices, each of which includes an outer casing with a first casing segment that is mounted to the module housing, fluidly sealed to the internal coolant chamber and, thus, exposed to the coolant fluid. An inboard-facing surface of a second casing segment of the vapor chamber's outer casing is mounted to an outboard-facing surface of the power device, whereas an outboard-facing casing surface is mounted to an inboard-facing surface of the power device.

Additional aspects of this disclosure are directed to motor vehicles equipped with electronic power module assemblies with direct-cooling vapor chamber systems. As used herein, the terms "vehicle" and "motor vehicle" may be used interchangeably and synonymously to include any relevant vehicle platform, such as passenger vehicles (ICE, REV, FEV, BEV, fuel cell, fully and partially autonomous, etc.), commercial vehicles, industrial vehicles, tracked vehicles, off-road and all-terrain vehicles (ATV), motorcycles, farm equipment, watercraft, aircraft, etc. In an example, a motor vehicle includes a vehicle body with multiple road wheels and other standard original equipment. Mounted on the vehicle body is one or more electric traction motors that operate alone (e.g., for FEV powertrains) or in conjunction with an internal combustion engine assembly (e.g., for HEV powertrains) to selectively drive one or more of the road wheels to thereby propel the vehicle. Also mounted on the vehicle body is one or more rechargeable traction battery packs that selectively store and transmit electric current to power the traction motor(s). The battery pack(s) and motor(s) may be interconnected via a high-voltage electric circuit.

Continuing with the discussion of the above example, the vehicle also includes one or more power module assemblies that govern electric exchanges between the traction battery pack(s) and motor(s). A power module assembly includes a module housing, which is attached to the vehicle body and includes an internal coolant chamber that circulates coolant fluid. One or more power semiconductor switching devices are mounted to the module housing, separated from the internal coolant chamber and fluidly isolated from the coolant fluid. Each power device is operable to modify electric current transmitted between the traction battery pack and the traction motor. To mitigate device-generated heat, the power module assembly includes a first two-phase, heat-spreading vapor chamber device with an outer casing having a casing segment that is mounted directly to the module housing, fluidly sealed to the internal coolant chamber and exposed to the coolant fluid. Another casing segment of the first vapor chamber device has an inboard-facing surface that is mounted directly to the power device's outboard-facing surface. A second two-phase, heat-spreading vapor chamber device includes an outer casing with a casing segment thereof mounted directly to the module housing, fluidly sealed to the coolant chamber and exposed to the coolant fluid. Another casing segment of the second vapor chamber device's outer casing has an outboard-facing surface that is mounted to the power device's inboard-facing surface. The outer casings each define a respective outer wall of the module housing. Notably, disclosed power module assemblies may be employed for both automotive and non-automotive applications alike.

Also presented herein are methods for manufacturing and methods for operating any of the disclosed power module assemblies, powertrains, and/or motor vehicles. In an example, a method is presented for constructing a power module assembly that is operable to control the transfer of electrical power between a power source and an electrical load. This representative method includes, in any order and in any combination with any of the above and below disclosed options and features: receiving a module housing with an internal coolant chamber configured to circulate a coolant fluid; mounting a power device to the module housing such that the power device is separated from the internal coolant chamber and fluidly isolated from the coolant fluid, the power device being operable to modify an electric current transmitted between the power source and the electrical load; mounting a first casing segment of an outer casing of a vapor chamber to the module housing such that the first casing segment is fluidly sealed to the internal coolant chamber and exposed to the coolant fluid; mounting an inboard casing surface of a second casing segment of the outer casing to an outboard surface of the power device; and mounting an outboard casing surface of the second casing segment of the outer casing to an inboard surface of the power device.

The above summary does not represent every embodiment or every aspect of this disclosure. Rather, the foregoing summary merely provides examples of some of the novel concepts and features set forth herein. The above features and advantages, and other features and attendant advantages of this disclosure, will be readily apparent from the following detailed description of illustrative examples and modes for carrying out the present disclosure when taken in connection with the accompanying drawings and the appended claims. Moreover, this disclosure expressly includes any and all combinations and subcombinations of the elements and features presented above and below.

BRIEF DESCRIPTION OF THE DRAWINGS

FIG. 3 is an elevated, perspective-view illustration of a representative high-voltage power module assembly with a direct-cooling vapor chamber system for power device thermal management in accord with aspects of the disclosed concepts.

FIG. 4 is a partially exploded, perspective-view illustration of the representative power module assembly of FIG. 3.

Figure 1:
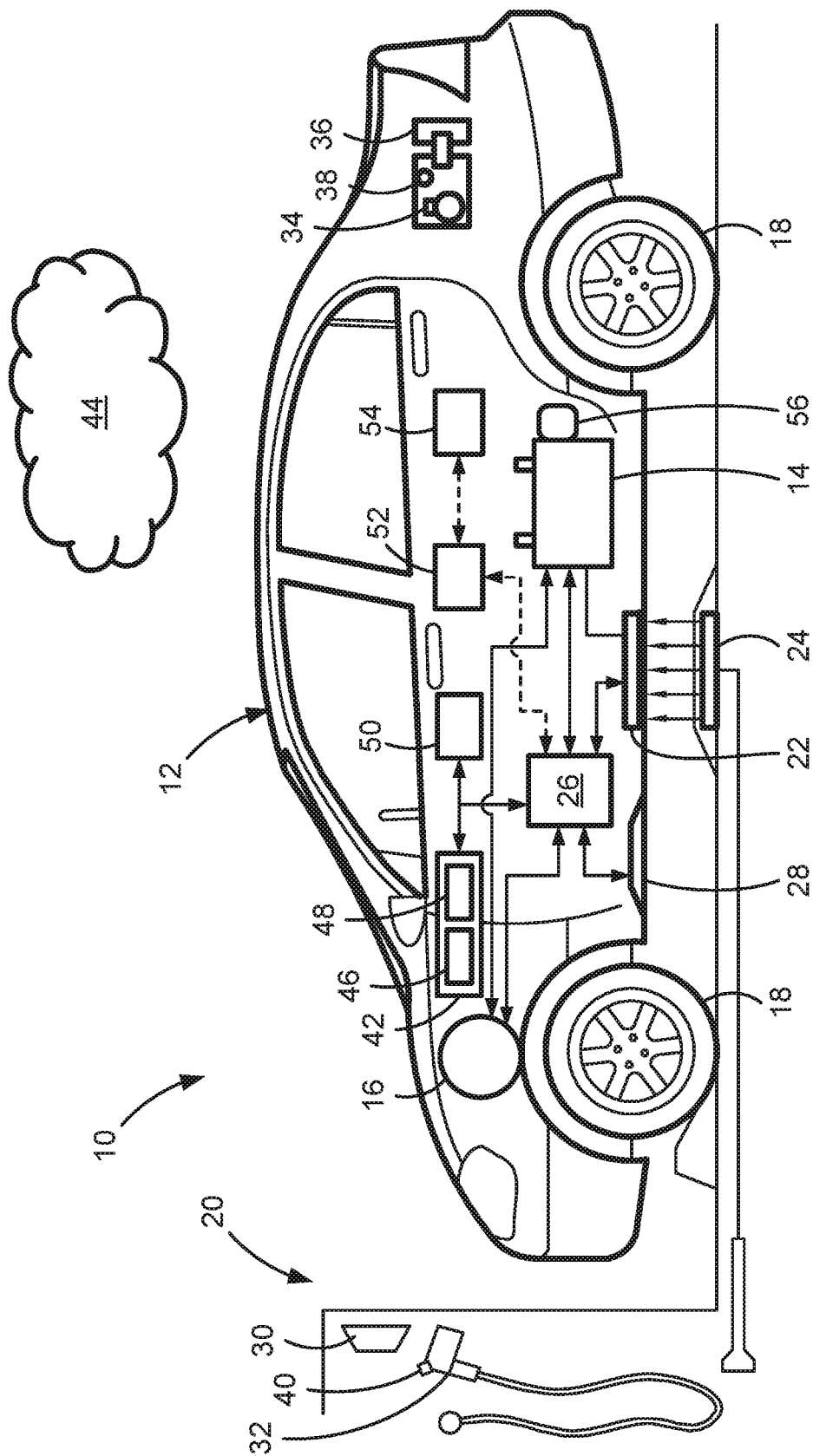
FIG. 1 is a partially schematic, side-view illustration of a representative electric-drive vehicle with a traction motor connected to a rechargeable traction battery pack by a high-voltage electrical system in accordance with aspects of the present disclosure.

The present disclosure is amenable to various modifications and alternative forms, and some representative embodiments are shown by way of example in the drawings and will be described in detail below. It should be understood, however, that the novel aspects of this disclosure are not limited to the particular forms illustrated in the above-enumerated drawings. Rather, the disclosure is to cover all modifications, equivalents, combinations, subcombinations, permutations, groupings, and alternatives falling within the scope of this disclosure as encompassed, for example, by the appended claims.

DETAILED DESCRIPTION

This disclosure is susceptible of embodiment in many different forms. Representative embodiments of the present disclosure are shown in the drawings and will herein be described in detail with the understanding that these embodiments are provided as an exemplification of the disclosed principles, not limitations of the broad aspects of the disclosure. To that extent, elements and limitations that are described, for example, in the Abstract, Introduction, Summary, and Detailed Description sections, but not explicitly set forth in the claims, should not be incorporated into the claims, singly or collectively, by implication, inference or otherwise.

For purposes of the present detailed description, unless specifically disclaimed: the singular includes the plural and vice versa; the words "and" and "or" shall be both conjunctive and disjunctive; the words "any" and "all" shall both mean "any and all"; and the words "including," "containing," "comprising," "having," and the like, shall each mean "including without limitation." Moreover, words of approximation, such as "about," "almost," "substantially," "generally," "approximately," and the like, may each be used herein in the sense of "at, near, or nearly at," or "within 0-5% of," or "within acceptable manufacturing tolerances," or any logical combination thereof, for example. Lastly, directional adjectives and adverbs, such as fore, aft, inboard, outboard, starboard, port, vertical, horizontal, upward, downward, front, back, left, right, etc., may be with respect to a motor vehicle, such as a forward driving direction of a motor vehicle, when the vehicle is operatively oriented on a horizontal driving surface.

Referring now to the drawings, wherein like reference numbers refer to like features throughout the several views, there is shown in FIG. 1 a schematic illustration of a representative automobile, which is designated generally at 10 and portrayed herein for purposes of discussion as a sedan-style, hybrid electric passenger vehicle. Packaged within a vehicle body 12 of the automobile 10, e.g., inside a passenger compartment, trunk compartment, or dedicated battery compartment, is a traction battery pack 14 that powers one or more electric motor-generator units 16 that drive one or more of the vehicle's road wheels 18 to thereby propel the vehicle 10. The illustrated automobile 10—also referred to herein as "motor vehicle" or "vehicle" for short—is merely an exemplary application with which features of this disclosure may be practiced. In the same vein, implementation of the present concepts for the specific electric-drive powertrain architecture presented in the drawings should also be appreciated as an exemplary application of the disclosed concepts. As such, it will be understood that aspects and features of this disclosure may be applied to other powertrain architectures, and implemented for any logically relevant type of motor vehicle. Moreover, only select components of the vehicle, powertrain, and power module assembly have been shown and will be described in additional detail herein. Nevertheless, the vehicles and systems discussed below may include numerous additional and alternative features, and other commercially available peripheral components, for example, to carry out the various protocols and/or algorithms of this disclosure.

FIG. 1 is a simplified illustration of the electric-drive vehicle 10 docked at and operably coupled to a vehicle charging station 20 for recharging an onboard rechargeable energy source, such as a high-voltage direct current (DC) traction battery pack 14. Traction battery pack 14 may take on many suitable configurations, including an array of lead-acid, lithium-ion, or other applicable type of rechargeable electric vehicle battery (EVB). To provide an operable coupling between the traction battery pack 14 and vehicle charging station 20, the vehicle 10 may include an inductive charging component 22, e.g., with an integrated induction coil, that is mounted to the underside of the vehicle body 12. This inductive charging component 22 functions as a wireless charging interface that is compatible with a wireless charging pad or platform 24, e.g., with an internal EMF coil, of the vehicle charging station 20. In the illustrated example, the wireless charging pad/platform 24 is located on the floor of the vehicle charging station 20, positioned in accordance with a "target location" that serves as a desired parking location for purposes of efficient and effective wireless charging of the vehicle 10. In particular, FIG. 1 depicts the vehicle 10 parked in proper fore-aft alignment and in proper starboard-port alignment that helps to ensure the inductive charging component 22 is substantially aligned in both lateral and longitudinal dimensions with the wireless charging pad/platform 24.

The vehicle charging station 20 may employ any heretofore and hereinafter developed type of wired and wireless charging technology, including inductive charging, radio charging, and resonance charging, as some non-limiting examples. In accordance with electromagnetic induction charging technology, the representative wireless charging pad 24 of FIG. 1 may be activated with electric current to generate an alternating electromagnetic field proximate the inductive charging component 22. This magnetic field, in turn, induces an electric current in the inductive charging component 22 of the vehicle 10. The induced current may be filtered, stepped-down, and/or phase-shifted by in-vehicle electrical modulation circuitry to charge the traction battery pack 14 or other energy source of the vehicle 10 (e.g., a standard 12V lead-acid starting, lighting, and ignition (SLI) battery, an auxiliary power module, etc.). A pack cooling system 56 may be integrated to the traction battery pack 14 to provide substantially uniform cooling of the modules within the pack, e.g., by providing a metered flow of coolant fluid.

Traction battery pack 14 stores energy that can be used for propulsion by the traction motor 16 and for operating other vehicle electrical systems. The traction battery pack 14 is communicatively connected (wired or wirelessly) to one or more vehicle controllers, represented in FIG. 1 by electronic control unit (ECU) 26, that regulates the operation of various onboard vehicle components. Contactors controlled by the ECU 26, for example, may isolate the traction battery pack 14 from other components when opened, and connect the traction battery pack 14 to other components when closed. The ECU 26 is also communicatively connected to each electric motor-generator unit (MGU) 16 to control, for example, bi-directional transfer of energy between the traction battery pack 14 and MGU 16. For instance, traction battery pack 14 may provide a DC voltage while the MGU 16 may operate using a three-phase AC current; in such an instance, ECU 26 converts the DC voltage to a three-phase AC current for use by the motor-generator 16. In a regenerative mode where the MGU 16 acts as an electric generator, the ECU 26 may convert three-phase AC current from the MGU 16 to DC voltage compatible with the traction battery pack 14. The representative ECU 26 is also shown communicating with charging component 22, for example, to condition the power supplied from the vehicle charging station 20 to the battery pack 14 to help ensure proper voltage and current levels. The ECU 26 may also interface with the charging station 20, for example, to coordinate the timing, amount, and user-preferences for delivery of power to and from the vehicle 10.

Vehicle charging station 20 of FIG. 1 also offers wired charging for electric vehicle 10 via a "plug-in" electrical connector 32, which may be any one of a number of different commercially available electrical connector types. By way of non-limiting example, electrical connector 32 may be a Society of Automotive Engineers (SAE) J1772 (Type 1) or J1772-2009 (Type 2) electrical connector with single or split phase modes operating at 120 to 240 volts (V) with alternating current (AC) at up to 80 amperes (A) peak current for conductive vehicle charging. Furthermore, the charging connector 32 can also be designed to meet the standards set forth in International Electrotechnical Commission (IEC) 62196-3 Fdis and/or IEC 62196-2, as well as any other presently applicable or hereafter mandated standards. A charge port 34 accessible on the exterior of vehicle body 12 is a wired charging interface functioning as an electrical inlet into which electrical connector 32 may be plugged or otherwise mated. This port 34 enables a user to easily connect and disconnect the vehicle 10 to/from a readily available AC or DC source, such as a public utility power grid, via charging station 20. Charge port 34 of FIG. 1 is not limited to any particular design, and may be any type of inlet, port, connection, socket, plug, etc., that enables conductive or other types of electrical connections. A hinged charge port door (CPD) 36 on vehicle body 12 can be selectively opened and closed to access and cover the charge port 34, respectively.

As part of the vehicle charging process, the electric-drive vehicle 10 may monitor wired/wireless charging availability, wireless power quality, and other related variables that may affect charging. According to the illustrated example, the vehicle ECU 26 of FIG. 1 communicates with and receives sensor signals from a monitoring system, represented herein by one or more onboard "resident" sensing devices 28 of the vehicle 10 and/or one or more off-board "remote" sensing devices 30 of the vehicle charging station 20. In practice, this monitoring system may include a single sensor, or it may include a distributed sensor architecture with assorted sensors packaged at similar or alternative locations to that which are shown in the drawings. A CPD sensor 38 mounted by the charge port 34 may sense, and be polled or read by the vehicle's ECU 26 to determine, a door status (open/closed) of the CPD 36. Additionally, a latching button 40, which helps to physically attach and secure the electrical connector 32 to the charge port 34, may include an internal switch (e.g., an SAE S3 type switch) that functions as a sensing device to detect whether or not the electrical connector 32 is operatively connected to the charge port 34.

The representative vehicle 10 of FIG. 1 may be originally equipped with a vehicle telecommunication and information ("telematics") unit 42 that wirelessly communicates (e.g., via cell towers, base stations and/or mobile switching centers (MSCs), etc.) with a remotely located or "off-board" cloud computing service system 44. Acting as both a user-input device and a vehicle-output device, telematics unit 42 may be equipped with an electronic video display device 46 and assorted input controls 48 (e.g., buttons, knobs, switches, trackpads, keyboards, touchscreens, etc.). These telematics hardware components may function, at least in part, as a resident vehicle navigation system, e.g., to enable assisted and/or automated vehicle navigation, and as a human/machine interface (HMI), e.g., to enable a user to communicate with the telematics unit 42 and other systems and system components of the vehicle 10. Optional peripheral hardware may include a microphone that provides a vehicle occupant with the ability to input verbal or other auditory commands; the vehicle 10 may be equipped with an embedded voice-processing unit programmed with a computational speech recognition software module. A vehicle audio system with one or more speaker components may provide audible output to a vehicle occupant and may be either a stand-alone device dedicated for use with the telematics unit 42 or may be part of a general audio system.

With continuing reference to FIG. 1, telematics unit 42 is an onboard computing device that provides a mixture of services, both individually and through its communication with other networked devices. Telematics unit 42 may be generally composed of one or more processors, each of which may be embodied as a discrete microprocessor, an application specific integrated circuit (ASIC), a dedicated control module, etc. Vehicle 10 may offer centralized vehicle control via ECU 26 that is operatively coupled to one or more electronic memory devices 50, each of which may take on the form of a CD-ROM, magnetic disk, IC device, semiconductor memory (e.g., various types of RAM or ROM), etc., with a real-time clock (RTC). Long-range vehicle communication capabilities with remote, off-board networked devices may be provided via one or more or all of a cellular chipset/component, a navigation and location chipset/component (e.g., global positioning system (GPS) transceiver), or a wireless modem, all of which are collectively represented at 52. Close-range wireless connectivity may be provided via a short-range wireless communication device (e.g., a BLUETOOTH® unit or near field communications (NFC) transceiver), a dedicated short-range communications (DSRC) component, and/or a dual antenna, all of which are collectively represented at 54. The communication devices described above may provision data exchanges as part of a periodic broadcast in a Vehicle-to-Vehicle (V2V) or vehicle-to-everything (V2X) communication system, e.g., Vehicle-to-Infrastructure (V2I), Vehicle-to-Pedestrian (V2P), Vehicle-to-Device (V2D), etc.

Figure 2:
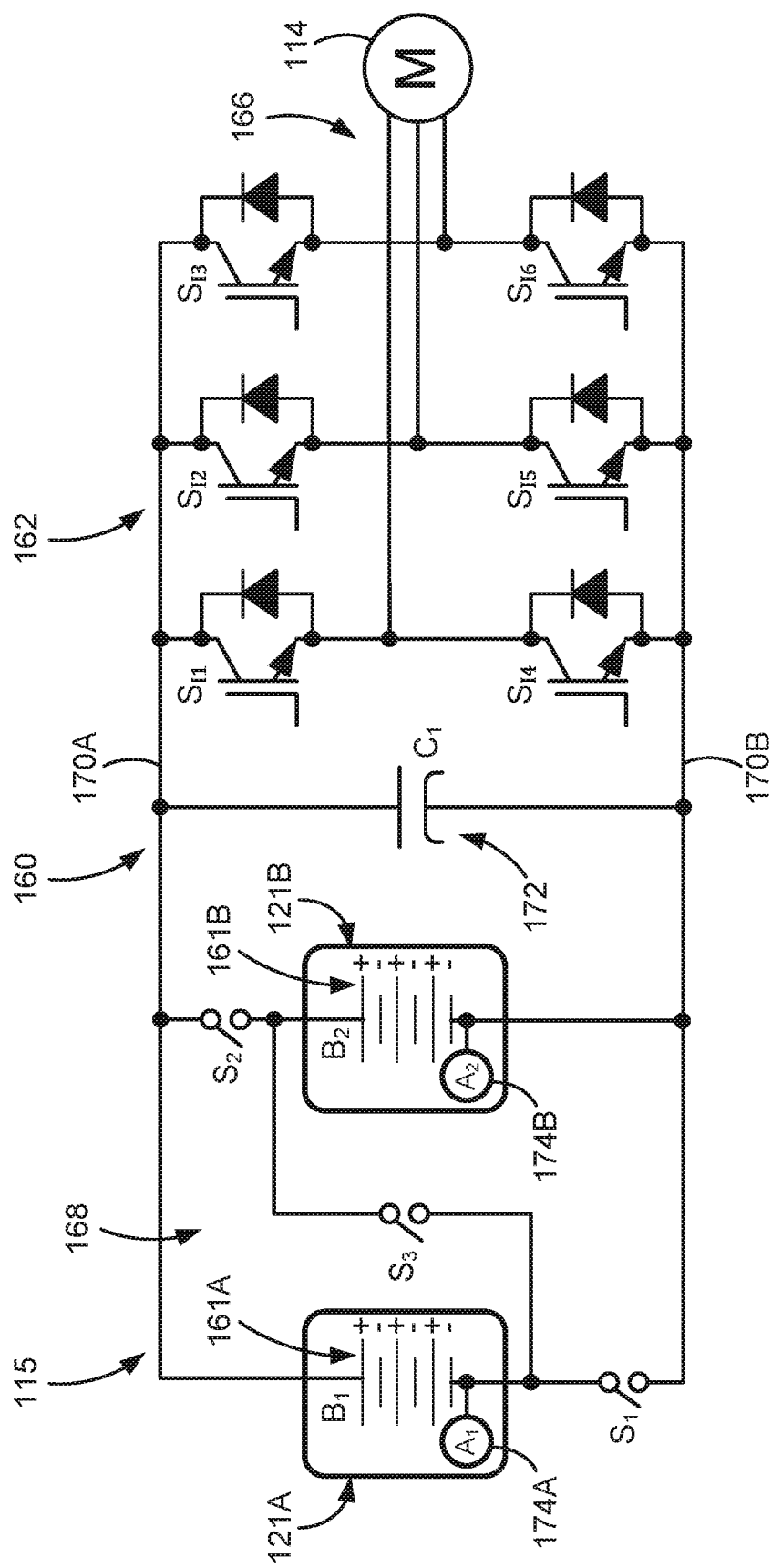
FIG. 2 is a schematic diagram of a representative electrified powertrain system with multiple traction battery packs connected to an electric motor/generator unit via a high-voltage main DC bus, DC bulk capacitor, and traction power inverter module (TPIM) assembly in accordance with aspects of the present disclosure.

Turning next to FIG. 2, there is shown a representative electrified powertrain architecture with a rechargeable energy storage system (RESS) 115 that is adapted for storing high-voltage, high ampere-hour electrical energy used for driving an electric load, such as MGU 16 of vehicle 10 of FIG. 1. RESS 115 may be a deep-cycle, high-ampere capacity battery system rated for approximately 400 to 800 VDC or more, for example, depending on a desired vehicle range, gross vehicle weight, and power ratings of the various loads drawing electrical power from the RESS 115. To this end, the RESS 115 may include multiple high-voltage, independently-rechargeable battery packs (B1) 121A and (B2) 121B that are selectively electrically connectable to a polyphase electric machine, such as a three-phase permanent magnet (PM) traction motor (M) 114. While two traction battery packs 121A, 121B and one traction motor 114 are shown in FIG. 2 for illustrative simplicity, a single traction battery pack or three or more traction battery packs may be used within RESS 115 to power any number of electric traction motors.

The first and second traction battery packs 121A, 121B may be connected in electrical parallel with respect to a high-voltage main DC bus 160 and a power inverter module (PIM) 162 for governing the transmission of electrical energy to and from the traction motor 114. Each pack 121A, 121B comes equipped with a respective stack of battery cells 161A and 161B, including lithium ion cells, lithium polymer cells, or any other rechargeable electrochemical cells providing a sufficiently high-power density, as well as any requisite conductive battery support structure, battery pack cooling system, and current conditioning hardware. The number and arrangement of battery cells 161A, 161B in each pack 121A, 121B may vary with the intended application of the RESS 115, for instance with 96 or more such cells per pack used in certain high-voltage applications. It should be appreciated that the representative powertrain architecture of FIG. 2 may include any of the options and features described above with respect to the vehicle drive system of FIG. 1, and vice versa.

A DC-to-AC and AC-to-DC power inverter module 162, which may be part of a traction power inverter module (TPIM), connects via polyphase windings 166 to traction motor 114 to transmit electrical energy between the motor 114 and battery packs 121A, 121B. The power inverter module 162 may incorporate multiple power inverters and respective motor control modules operable to receive motor control commands and control inverter states therefrom for providing motor drive or regenerative functionality. The power inverter module 162 may comprise a set of semiconductor switches $S_{I1}$-$S_{I6}$ (also referred to herein as "inverter switches") that cooperatively convert direct current power from the energy storage devices—battery packs 121A, 121B—to alternating current power for powering the traction motor 114 via high-frequency switching. Each semiconductor switch $S_{I1}$-$S_{I6}$ may be embodied as a voltage-controlled bipolar switching device in the form of insulated gate bipolar transistor (IGBT), metal-oxide semiconductor field effect transistor (MOSFET), wideband gap (WBG) device, or other suitable switch having a corresponding gate to which a gate signal is applied to change the on/off state of a given switch. There is typically at least one semiconductor switch for each phase of a three-phase electric machine.

The traction battery packs 121A, 121B include a set 168 of solid-state relay switches or contactors S1-S3 (also referred to herein as "pack contactor switches") that are independently responsive to signals from a suitable controller or dedicated control module to govern the electrical output of the battery system. Contactors/switches S1-S3 are adapted to close under electrical load so as to ensure the instantaneous or near instantaneous delivery of electrical power, e.g., to a vehicle's propulsion system and to drive any number of the in-vehicle accessories. As with the semiconductor inverter switches within the PIM 162, pack contactor switches 168 may be constructed of highly efficient switching devices, such as wide-gap gallium nitride (GaN) or silicon carbide (SiC) MOSFETs, IGBTs, or other suitable electronic devices. Respective real-time electrical currents of the traction battery pack 121A, 121B of FIG. 2 may be measured using dedicated first and second current sensors $(A_1)$ 174A and $(A_2)$ 174B, respectively, which may be integrated within a battery housing of a corresponding battery pack.

A DC output voltage of the traction battery packs 121A, 121B is delivered across positive and negative voltage bus rails 170A and 170B, respectively, with a fixed-type, high-frequency DC bulk capacitor (C1) 172 placed in electrical parallel with both traction battery packs 121A, 121B. The high-frequency DC bulk capacitor 172 is portrayed in FIG. 2 as a single device for ease of illustration. It should be appreciated, however, that the DC bulk capacitor 172 may be composed of multiple capacitor devices that are electrically arranged in series, parallel, or any other suitable electrical configuration to provide electrical capacitance in the electric circuit between positive and negative conductors of the high-voltage main DC bus 160. A RESS sensing system (not shown) may be arranged to monitor operating parameters of the main DC bus 160, PIM 162, and bulk capacitor 172, such as a bus electrical potential measured across the positive and negative bus rails 170A and 170B of the high-voltage main DC bus 160.

Capacitor size of the DC bulk capacitor 172 may be described in terms of its total capacitance, which may be selected based upon any number of variables, including expected voltage range, peak current, and ripple voltage amplitude across the main DC bus 160. In this regard, capacitance of a bulk capacitor may also be determined in relation to parameters such as peak voltage, root mean square (RMS) current, minimum and maximum bus current levels, operating temperatures, and other factors. As such, the size of the DC bulk capacitor 172, in terms of its total capacitance, may be selected based upon expected DC bus voltage ripple when operating the power inverter module 162 employing, for example, a six-step mode of operation. As yet another option, the DC bulk capacitor 172 may take on the form of any suitable electrical capacitive storage device, be it electrolytic devices, aluminum devices, ceramic devices, plastic capacitance devices, wound film devices, etc. Furthermore, the conductive material employed by each capacitor device may comprise any suitable electrically conductive material, such as aluminum, copper, gold, zinc, or an alloy or composite of the foregoing metallic materials.

Figure 5:
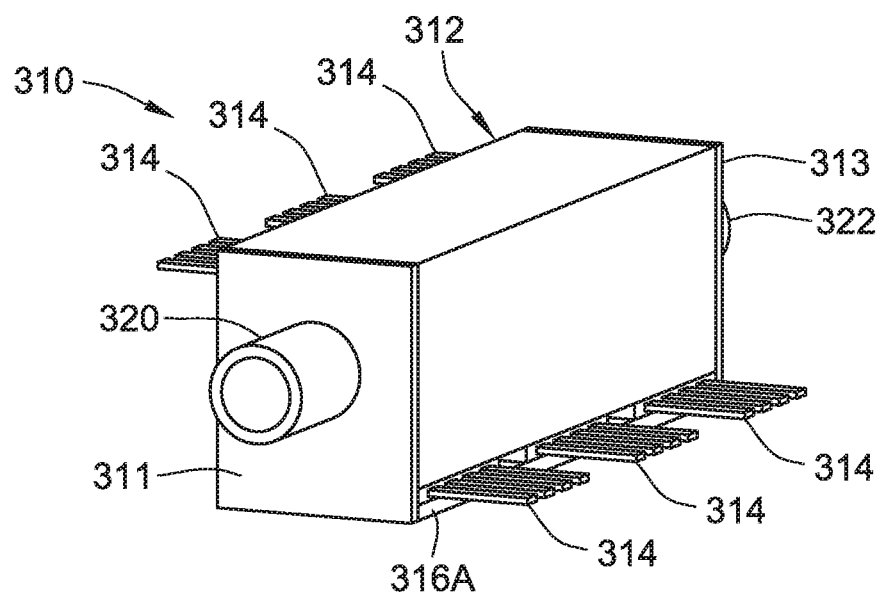
FIG. 5 is an elevated, perspective-view illustration of another representative high-voltage power module assembly with another direct-cooling vapor chamber system for power device thermal management in accord with aspects of the disclosed concepts.

FIGS. 3 and 5 each present a novel electronic power module assembly—TPIM 210 of FIG. 3 and TPIM 310 of FIG. 5—that is equipped with a direct-cooling vapor chamber system for optimized thermal management of the module's individual power devices. Power inverter modules 210, 310 may be electrically interposed between a power source, such as traction battery pack 14 of FIG. 1 or RESS 115 of FIG. 2, and an electrical load, such as MGU 16 of FIG. 1 or traction motor 114 of FIG. 2, for maintaining high-voltage, high-frequency power transmission with smoothed AC/DC current conversion. In this regard, either of the power inverter modules 210, 310 may be incorporated into the representative applications of FIGS. 1 and 2 or, alternatively, may be implemented into other commercial applications, including power utility grids, photovoltaic balancing systems, fuel cell generators, etc. In the same vein, while illustrated and described as a traction power inverter module, it is envisioned that the novel features discussed below with respect to FIGS. 3-9 may be implemented for other power module assemblies, including an On-Board Charge Module (OBCM), a Single Power Inverter Module (SPIM), a Belt-Alternator-Starter (BAS) Power Inverter Module (BPIM), a Rear Power Inverter Module (RPIM), etc.

Figure 6:
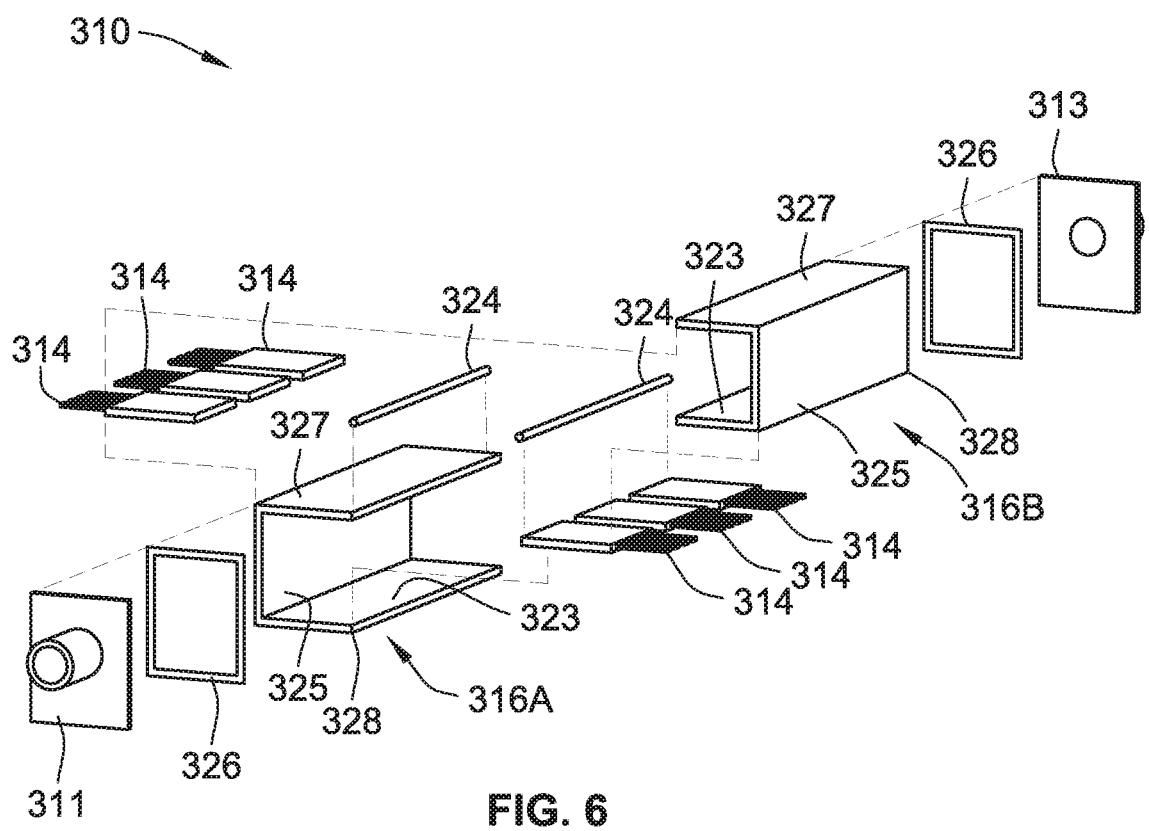
FIG. 6 is a partially exploded, perspective-view illustration of the representative power module assembly of FIG. 5.

With collective reference to FIGS. 3 and 4, power inverter module 210 assembly is constructed with, among other things, a protective outer housing 212, one or more power semiconductor switching devices 214, and one or more two-phase, heat-spreading vapor chamber 216A and 216B devices. In the same vein, power inverter module 310 assembly of FIGS. 5 and 6 is constructed with a protective outer housing 312, at least one power semiconductor switching device 314, and at least one two-phase, heat-spreading vapor chamber 316A and 316B device. Although shown comprising three power devices 214 (FIG. 4) or six power devices 314 (FIG. 6) with two vapor chambers 216A-B 316A-B, it is envisioned that a disclosed electronic power module assembly may include greater or fewer than the illustrated number of power devices and vapor chambers. By way of non-limiting example, the longitudinal length of the module housing 212 may be extended to accommodate six (6) or more power devices.

Select portions of module housings 212 and 312 may be formed from an electrically insulative material, such as plastic, epoxy, and/or epoxy-impregnated fiber glass, or formed from a metallic material, including cast or stamped aluminum, steel, etc. As shown, module housing 212 of FIG. 3 is fabricated with multiple outer housing walls, including a first (front end) outer wall 211, a second (back end) outer wall 213 longitudinally spaced from the first outer wall 211, and a third (top) outer wall 215 substantially perpendicular to the first and second walls 211, 213. The third outer wall 215 extends between and adjoins at opposing longitudinal ends thereof with the first and second outer walls 211, 213. These three housing outer walls 211, 213, 215 may be formed as a single-piece, unitary structure. Comparatively, module housing 312 of FIG. 5 is fabricated with a first (front end) outer wall 311 and a second (back end) outer wall 313 that is substantially parallel to and longitudinally spaced from the first outer wall 311. The housings' outer walls cooperatively define internal coolant chambers 217 (FIG. 7) and 317 (FIG. 8) through which circulates a heat-mitigating coolant fluid 218 and 318 (e.g., an ethylene glycol-based coolant). In this regard, each housing 212, 312 has a coolant inlet port 220 and 320 that provides a fluid connection point to, and thereby receives coolant fluid from, a coolant source (e.g., coolant feed line, electric pump, and heat exchanger). Coolant fluid is returned to the coolant source (e.g., coolant return line and coolant fluid volume) from the power inverter module 210, 310 via a coolant outlet port 222 and 322 projecting from the housing 212, 312 on an opposite side of the inlet port 220, 320.

In addition to providing an interface to heat-exchanging coolant fluid, the power inverter modules' outer housings 212, 312 provide mechanical support, corrosion resistance, vibration protection, thermal protection, etc., to the devices mounted thereto. Power inverter module 210, 310 may include a number of optional features, such as an electrically conductive base plate (not shown) onto which the module housing 212 is rigidly mounted using, for example, threaded fasteners. An active (drain) terminal of each power device 214, 314 may be electrically connected to this base plate, while an active (source) terminal of each device 214, 314 is electrically connected to conductive PIM tabs, each of which provides a terminal connection point with a polyphase winding. As will be explained in further detail below, any one of the module housing's outer walls may be fashioned from a heat-sinking vapor chamber device. Alternatively, a module housing may be a unitary structure that is constructed separate from, and later assembled with, the vapor chamber devices. It should be appreciated that the shape, size and configuration of a module housing may be varied from that shown in the drawings to accommodate design constraints of other applications.

Mounted within the PIM's outer housing 212, 312 is at least one or, as shown, three or six power devices 214, 314 that are operable, singly and collectively, to modulate the transfer of electric current between an electrical power source and an electrical load. In the representative TPIM implementation, each power device 214, 314 is an integrated circuit (IC) based semiconductor switching device, such as an IGBT device, WBG device, MOSFET device, and the like. One example is the HybridPACK™ DSC S2 Half-Bridge Power Module produced by Infineon Technologies AG. It may be desirable, for at least some applications, that all of the power devices 214, 314 within a given PIM assembly 210, 310 be substantially identical with one another. For purposes of succinctness and brevity, both sets of power devices 214, 314 will be described in further detail below with respect to the representative semiconductor switch device 214 presented in FIG. 9, as indicated at F9 in FIGS. 7 and 8. Although not shown, other electronic devices may be operatively supported on the module housing 212, such as a contact resistor board, motor control unit, etc.

The power devices 214, 314 are securely mounted, e.g., via compression hardware, mounting brackets, mechanical fasteners, brazing, soldering, adhesives, or other suitable techniques, on interior surfaces of the PIM assembly 210, 310. Specifically, the illustrated power devices 214, 312 are juxtaposed in coplanar alignment, nested inside a pocket 219 (FIG. 7) and 319 (FIG. 8) that is defined on at least three sides thereof by the vapor chambers 216A-B, 316A-B. A PIM assembly 210, 310 may comprise a single device-receiving pocket 219 extending longitudinally along a bottom side of the module housing 212, as seen in FIG. 8, or multiple discrete pockets 319 disposed on opposing sides of the module housing 312, as seen in FIG. 8. In this manner, the mutually parallel power devices 214, 314 are sandwiched between the vapor chambers 216A-B, 316A-B and physically isolated from the coolant chamber 217, 317. Electrical tabs 221, 321 of the power devices 214, 314 project transversely outwards from the module housings 212, 312. Optional configurations may include a series of longitudinally spaced pockets, each of which receives therein and stores a respective power device.

For PIM architectures in which every power device 214 is mounted in a lone, shared pocket 219, a single (first) polymeric seal strip 224A may be compressed between interfacing segments of the vapor chambers 216A, 216B to fluidly isolate the power devices 214 from the coolant chamber 217. A pair of horizontally spaced polymeric seal strips 224B and 224C are compressed between and, thus, fluidly seal the vapor chambers 216A, 216B to the module housing 212. It may be preferable, for at least some embodiments, that each seal strip 224A-C is a single-piece, continuous structure that extends substantially the entire length of the module housing 212. In this instance, the seal strips 224A-C may also double to fluidly seal the coolant chamber 317. While shown as an elongated weatherstrip with a circular transverse cross-section, disclosed seal strips may take on alternative geometries, materials, and constructions without departing from the intended scope of this disclosure.

On the other hand, disclosed PIM architectures with multiple discrete pockets 319 into which are mounted individual power devices 314 may employ an assortment of different fluid seals to operatively interconnect the housing 312, power devices 314, and vapor chambers 316A-B. Consistent with the representative example set forth in FIGS. 5 and 6, multiple seal strips 324 are compressed between interfacing segments of the vapor chambers 316A, 316B to fluidly isolate the power devices 314 from the coolant chamber 317. For any of the disclosed PIM architectures, a rectangular-shaped, polymeric O-ring 326 may be compressed between and, thus, fluidly seal each vapor chamber 316A-B to its corresponding housing end wall 311, 313. Similar to the seal strips 224A-C discussed above, the seal strips 324 and O-rings 326 may collectively function to fluidly seal the coolant chamber 317. In so doing, one or more inboard-facing surfaces of each vapor chamber 216A-B, 316A-B is directly exposed to the coolant fluid 218, 318 inside the internal coolant chambers 217, 317, as best seen in FIGS. 7 and 8.

With continuing reference to FIGS. 3-6, the vapor chambers 216A-B, 316A-B provide thermodynamic conduits that interface the opposing inboard and outboard-facing surfaces of the power devices 214, 314 with the coolant fluid 218, 318 circulating through the module housing's internal coolant chamber 217, 317. In accord with the illustrated examples, a power inverter module 210, 310 device is constructed with two hermetically sealed, self-contained vapor chambers 216A-B, 316A-B, each of which physically abuts and thereby cools one or more of the power devices 214, 314. It is envisioned, however, that a power inverter module 210, 310 may comprise greater or fewer than two vapor chambers, which may take on alternative shapes, sizes and packaging locations from the illustrated configurations. For instance, an individual vapor chamber may be dedicated to cooling a single one of the power devices.

Comparing the partially exploded views of FIGS. 4 and 6 reveals that the vapor chamber 216A and 216B devices of FIGS. 3 and 4 have an L-shaped geometry, whereas the vapor chamber 316A and 316B devices of FIGS. 5 and 6 have a U-shaped geometry. Notwithstanding this distinction in geometric shape, it may be desirable, for at least some applications, that the structural contents and overall operation of the illustrated vapor chambers 216A-B, 316A-B be substantially identical with one another. For purposes of conciseness and clarity, all four vapor chambers 217A-B, 316A-B are described below with respect to the representative vapor chambers 216 illustrated in FIG. 9. Each vapor chamber 216 device may be composed of a rigid, thermally conductive outer casing 228 (e.g., formed from a flattened and contoured copper pipe or crimped copper plates) with a working fluid (filled and hollow arrows 230), a fluid-wicking structure 232, and a stanchion-like endoskeletal support structure 234 packaged inside the outer casing 228. The wicking structure 234 may be fabricated from an assortment of suitable materials, such as a roving of fine fibers, a wrapped textile, intertwined metal wires, a mesh screen, directly sculptured from an inner surface of the casing 228 for a grooved wick, copper particles for a sintered powder wick, etc. Working fluid 230, be it in fluid or gas form, may comprise a mixture of water and refrigerant. Each vapor chamber 216 may be a hermetically sealed, discrete unit that lacks fluid porting for exchanging coolant fluid with the internal coolant chamber 217.

Figure 7:
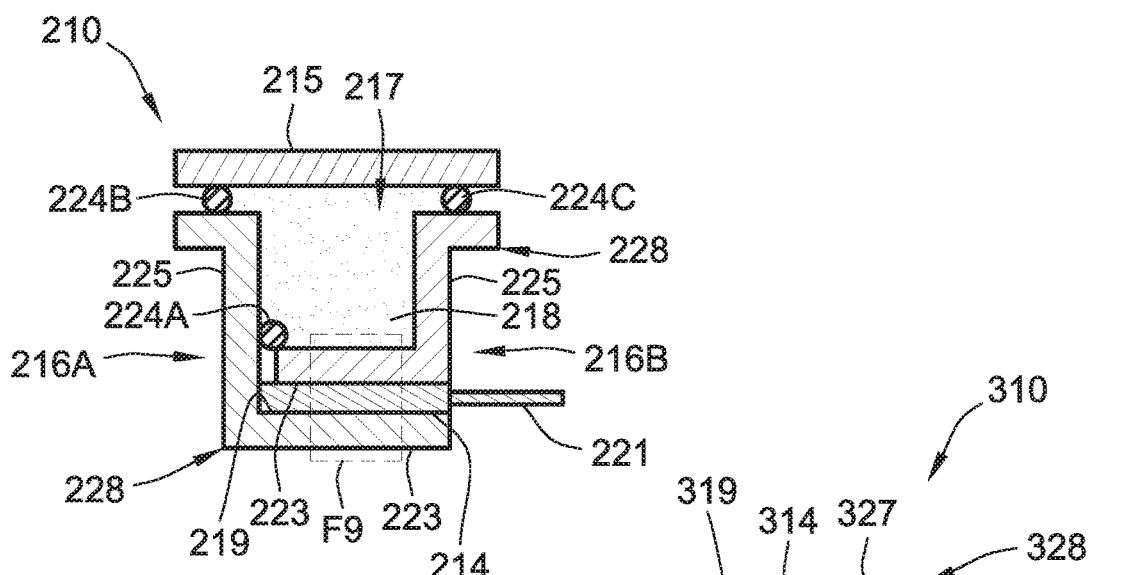
FIG. 7 is a sectional, end-view illustration of the representative power module assembly of FIG. 3.
Figure 8:
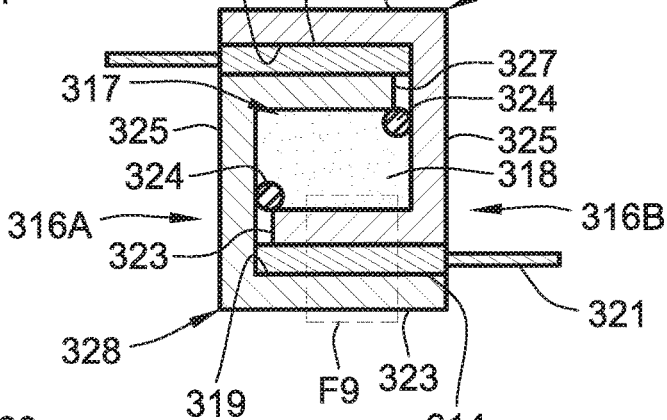
FIG. 8 is a sectional, end-view illustration of the representative power module assembly of FIG. 5.
Figure 9:
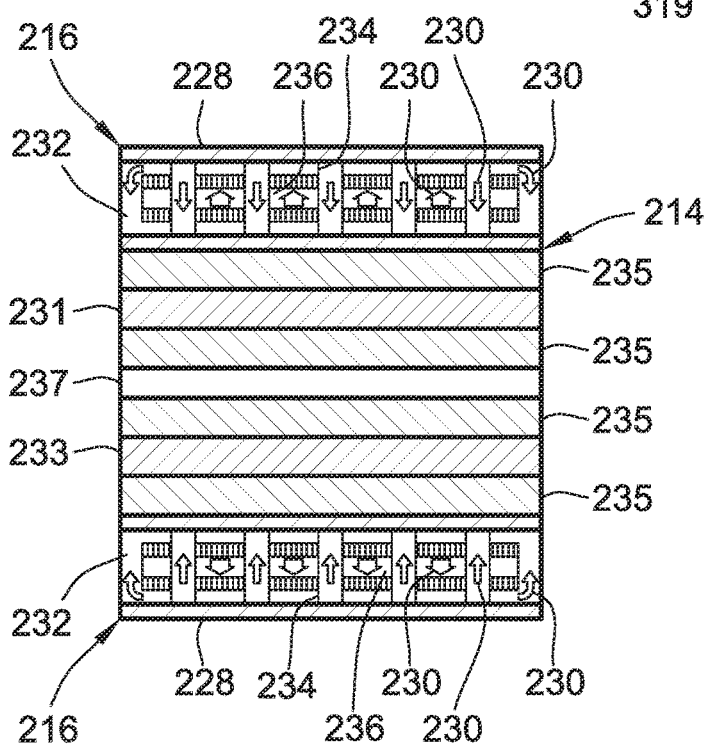
FIG. 9 is an enlarged sectional illustration of select portions of the representative vapor chamber device and power device of FIGS. 7 and 8.

Turning to FIGS. 3, 4 and 7, the L-shaped outer casing 228 of each vapor chamber 216A, 216B device is composed of three adjoining sections: a horizontally oriented, bottom (first) casing segment 223, a vertically oriented, side (second) casing segment 225, and a horizontally oriented, flanged (third) casing segment 227. First casing segment 223 is vertically spaced from and substantially parallel to the module housing's top wall 215. Comparatively, second casing segment 225 projects substantially perpendicularly from a lateral edge of the first casing segment 223. The third casing segment 227, on the other hand, projects transversally from an upper edge of the second casing segment 225, oriented substantially parallel to the first casing segment 223. Longitudinal ends of the first, second and third casing segments 223, 225, 227 of the outer casing 228 extend between and adjoin (e.g., via crimping, welding, brazing, etc.) with the longitudinally spaced end walls 211, 213 of the module's outer housing 212. Likewise, lateral edges of the flanged casing segments 227 adjoin (e.g., via crimping, welding, brazing, etc.) with the lateral edges of the module housing's top wall 215. With this arrangement, the two vapor chamber's casings 228 and the housing's outer walls 211, 213, 215 collectively define the internal coolant chamber 217. What's more, the horizontal casing segment 223 of the first vapor chamber 216A defines a bottom-most outer wall of the module housing 212, whereas the vertical casing segments 225 of the first and second vapor chambers 216A, 216B each defines one of the laterally spaced (left and right) side walls of the module housing 212.

With collective reference to FIGS. 5, 6 and 8, the U-shaped outer casing 328 of each vapor chamber 316A, 316B device is composed of three adjoining sections: a horizontally oriented, bottom (first) casing segment 323, a vertically oriented, middle (second) casing segment 325, and a horizontally oriented, top (third) casing segment 327. First casing segment 323 is vertically spaced from and substantially parallel to the third casing segment 327. In this regard, second casing segment 325 extends between and projects substantially perpendicularly from lateral edges of the first and second casing segments 223, 225. The first and third casing segments 323, 327 of both the first and second vapor chambers 316A, 316B are substantially parallel with one another. Longitudinal ends of the outer casing's three casing segments 323, 325, 327 extend between and adjoin (e.g., via any of the techniques described above or readily suitable) with the module's end walls 311, 313. Likewise, lateral edges of the third casing segments 327 are fluidly sealed (e.g., via seal strips 324) with abutting internal surfaces of the second casing segments 325. With this arrangement, the vapor chamber casings 328 and the end walls 311, 313 collectively define the internal coolant chamber 317. Furthermore, the first casing segment 323 of the first vapor chamber 316A defines a bottom-most outer wall of the module housing 312, the third casing segment 327 of the second vapor chamber 316B defines a top-most outer wall of the module housing 312, and the vertical casing segments 325 of the vapor chambers 316A, 316B each defines one of the laterally spaced (left and right) side walls of the module housing 312.

As best seen in FIG. 7, an inboard-facing surface ("casing surface") of the bottom casing segment 223 of the first vapor chamber 216A is mounted directly to outboard-facing surfaces of the three power devices 214, whereas an outboard-facing surface of the bottom casing segment 223 of the second vapor chamber 216B is mounted directly to inboard-facing surfaces of the power devices 214. In the same vein, an inboard-facing casing surface of the bottom casing segment 323 of the first vapor chamber 316A is mounted directly to outboard-facing surfaces of the bottom row of power devices 314, whereas an outboard-facing casing surface of the bottom casing segment 323 of the second vapor chamber 316B is mounted directly to inboard-facing surfaces of the bottom row of power devices 314. An inboard-facing surface of the top casing segment 327 of the second vapor chamber 316A is mounted directly to outboard-facing surfaces of the top row of power devices 314, whereas an outboard-facing surface of the top casing segment 327 of the first vapor chamber 316A is mounted directly to inboard-facing surfaces of the top row of power devices 314. Brazing, soldering, or welding the interfacing surfaces of the power devices 214, 314 and the vapor chambers 216A-B, 316A-B ensures the most effective exchange of heat while optionally eliminating the need for dedicated mounting hardware, adhesives, fasteners, etc.

During operation of a power inverter module 210, 310 assembly, the power devices 214, 314 will generate a significant amount of heat. The power devices 214, 314 will convect a portion of this heat through its inboard and outboard-facing surfaces directly to the vapor chambers 216A-B, 316A-B. This heat will pass through the interfacing surfaces of the vapor chamber 216, causing the working fluid 230 sealed within the outer casing 228 to evaporate. When the working fluid 230 is vaporized from absorbing device-generated heat, the fluid-wicking structure 232 will draw the vaporized fluid 230 from a hot side of the outer casing 228 (e.g., the side closest to and contacting the power device 214), through a vapor core 236 defined at the center of the wicking structure 232. The vaporized working fluid 230 expands and spreads to adjacent segments of the casing 228. Upon reaching a cold side of the outer casing 228 (e.g., the side farthest from the power device 214 and segments distal from the power device 314), the working fluid 230 is condensed by the coolant fluid 218 and ambient air contacting the outer casing 228. When condensed, the fluid-wicking structure 232 draws the working fluid 230 back to the hot side of the outer casing 228.

Aspects of the disclosed concepts are also directed to methods for making and methods for using any of the disclosed vehicles, powertrains, and power modules. Some or all of the operations described in further detail below may be representative of an algorithm or workflow process that corresponds to processor-executable instructions that may be stored, for example, in main, auxiliary and/or remote memory, and executed, for example, by a resident or remote controller, processing unit, control logic circuit, or other module or network of devices, to perform any or all of the above or below described functions associated with the disclosed concepts. It should be recognized that the order of execution of these operations may be changed, additional operations may be added, and some of the operations described may be modified, combined, or eliminated.

A method of assembling a power module assembly, such as PIM 210 of FIGS. 3 and 4 or PIM 310 of FIGS. 5 and 6, may start with fabricating, retrieving, or loading (collectively "receiving") a module housing, such as protective outer housing 212, with an internal coolant chamber designed to circulate therethrough a coolant fluid. One or more power devices, such as power semiconductor switching devices 214, 314, are mounted to internal surfaces of the module housing. The power devices are packaged such that each power device is physically separated from the internal coolant chamber and concomitantly fluidly isolated from the coolant fluid. One or more vapor chambers, such as two-phase, heat-spreading vapor chambers 216A-B, 316A-B, are also mounted to the module housing. This may comprise mounting one or more casing segments of an outer casing of a vapor chamber device to the module housing such that at least one casing segment is fluidly sealed to the internal coolant chamber and exposed to the coolant fluid. Prior to, contemporaneous with, or after attaching the vapor chamber(s) to the module hosing, an inboard casing surface of a casing segment of the outer casing is mounting to an outboard surface of the power device, and an outboard casing surface of a casing segment of the outer casing of a vapor chamber is mounted to an inboard surface of the power device.

The aforementioned method may also comprise forming the outer casing of the vapor chamber with adjoining casing segments that are shaped and sized to accommodate the dimensions of the power devices. The outer casing may then be bent into an L-shaped or U-shaped structure. The method may optionally comprise potting the power device in a layer of direct-bonded copper (DBC) or direct-bonded aluminum (DBA). For instance, FIG. 9 portrays the power device 214 as a layered laminate structure with first and second substrates 231 and 233 (e.g., formed from aluminum oxide ($Al_2O_3$), aluminum nitride (AlN), or silicon nitride ($Si_3N_4$)), each of which is sandwiched between two DBC layers 235 of copper-aluminum (CuAl) alloy, and bonded to an opposing face of a silicon-carbide (CiC) IGBT power device chip 237. In this instance, the abutting casing segments of the top and bottom vapor chambers 216 are shown brazed/soldered directly to outboard DBC layers 235. The substrates 231 and 233 may be soldered or pasted directly on the opposing sides of the IGBT power device chip 237. Once the vapor chambers are attached to the power devices, the seal strips, O-rings, and/or other suitably sealing mechanism may be applied to seal off and form the internal coolant chamber. Optionally, a silver paste or thermal-interface adhesive may be applied on to select sections of the power devices and vapor chambers. Likewise, an adhesive sealant may be applied along select sections of the internal coolant chamber, e.g., at joint regions between the bracket housing and vapor chamber casings. The method may also comprise applying a compression structure or fastener to hold the power devices in position.

Aspects of the present disclosure have been described in detail with reference to the illustrated embodiments; those skilled in the art will recognize, however, that many modifications may be made thereto without departing from the scope of the present disclosure. The present disclosure is not limited to the precise construction and compositions disclosed herein; any and all modifications, changes, and variations apparent from the foregoing descriptions are within the scope of the disclosure as defined by the appended claims. Moreover, the present concepts expressly include any and all combinations and subcombinations of the preceding elements and features.

What is claimed:

1. A power module assembly for controlling transfer of electrical power between a power source and an electrical load, the power module assembly comprising:
a module housing including an internal coolant chamber configured to circulate coolant fluid;
a power device mounted to the module housing, separated from the internal coolant chamber, and fluidly isolated from the coolant fluid, the power device being operable to modify an electric current transmitted between the power source and the electrical load; and
a vapor chamber including an outer casing with a first casing segment mounted to the module housing, fluidly sealed to the internal coolant chamber, and exposed to the coolant fluid, and a second casing segment with an inboard casing surface mounted to an outboard surface of the power device and an outboard casing surface mounted to an inboard surface of the power device.

2. The power module assembly of claim 1, wherein the module housing further includes a plurality of housing walls interconnected with the vapor chamber to cooperatively define the internal coolant chamber.

3. The power module assembly of claim 2, wherein the housing walls include opposing first and second end walls, and wherein the outer casing of the vapor chamber extends between and adjoins at first and second ends of the outer casing with the first and second end walls, respectively, such that the vapor chamber defines an outer wall of the module housing.

4. The power module assembly of claim 3, wherein the outer wall defined by the vapor chamber includes a pair of substantially orthogonal outer walls of the module housing.

5. The power module assembly of claim 4, wherein the housing walls of the module housing further include an outer housing wall extending between and adjoining at first and second ends of the outer housing wall with the first and second end walls, respectively, and wherein the first casing segment of the vapor chamber includes a flange mounted to the outer housing wall.

6. The power module assembly of claim 4, wherein the vapor chamber includes first and second U-shaped vapor chambers each defining a respective pair of substantially orthogonal outer walls of the module housing.

7. The power module assembly of claim 1, wherein the vapor chamber includes first and second vapor chambers, and the outer casing includes first and second outer casings of the first and second vapor chambers, respectively, the first casing segment of each of the first and second outer casings being mounted to the module housing, fluidly sealed to the internal coolant chamber, and exposed to the coolant fluid.

8. The power module assembly of claim 7, wherein the power device is a first power device, the inboard casing surface of the second casing segment of the first outer casing is mounted to the outboard surface of the first power device, and the outboard casing surface of the second casing segment of the second outer casing is mounted to the inboard surface of the first power device such that the first power device is sandwiched between the first and second vapor chambers.

9. The power module assembly of claim 8, further comprising a second power device, wherein the first and second outer casings each includes a respective third casing segment, an outboard casing surface of the third casing segment of the first outer casing is mounted to the inboard surface of the second power device, and the inboard casing surface of the third casing segment of the second outer casing is mounted to the outboard surface of the second power device such that the second power device is sandwiched between the first and second vapor chambers.

10. The power module assembly of claim 1, wherein the vapor chamber further includes a working fluid, a fluid-wicking structure, and a support structure packaged inside the outer casing.

11. The power module assembly of claim 10, wherein the fluid-wicking structure defines a vapor core and is configured to draw the working fluid, when vaporized, from a hot side of the outer casing, through the vapor core, to a cold side of the outer casing, and draw the working fluid, when condensed at the cold side of the outer casing, back to the hot side of the outer casing.

12. The power module assembly of claim 1, further comprising a first polymeric seal strip fluidly sealing the vapor chamber to the module housing, and a second polymeric seal strip fluidly isolating the power device from the coolant fluid.

13. The power module assembly of claim 1, further comprising first and second polymeric O-rings fluidly sealing the vapor chamber to the module housing, and a first polymeric seal strip fluidly isolating the power device from the coolant fluid.

14. An electric-drive vehicle, comprising:
a vehicle body with a plurality of road wheels attached to the vehicle body;
a traction motor attached to the vehicle body and configured to drive one or more of the road wheels to thereby propel the vehicle;
a traction battery pack attached to the vehicle body and configured to transmit an electric current with the traction motor; and
a power module assembly including:
a module housing attached to the vehicle body and including an internal coolant chamber configured to circulate coolant fluid;
a power semiconductor switching device (power device) mounted to the module housing, separated from the internal coolant chamber, and fluidly isolated from the coolant fluid, the power device being operable to modify the electric current transmitted between the traction battery pack and the traction motor;
a first two-phase, heat-spreading vapor chamber device with a first outer casing having a first casing segment mounted to the module housing, fluidly sealed to the internal coolant chamber, and exposed to the coolant fluid, and a second casing segment having an inboard casing surface mounted to an outboard surface of the power device, the first outer casing defining a first outer wall of the module housing; and
a second two-phase, heat-spreading vapor chamber device with a second outer casing having a first casing segment mounted to the module housing, fluidly sealed to the coolant chamber, and exposed to the coolant fluid, and a second casing segment having an outboard casing surface mounted to an inboard surface of the power device, the second outer casing defining a second outer wall of the module housing.

15. A method of constructing a power module assembly for controlling transfer of electrical power between a power source and an electrical load, the method comprising:
receiving a module housing with an internal coolant chamber configured to circulate a coolant fluid;
mounting a power device to the module housing such that the power device is separated from the internal coolant chamber and fluidly isolated from the coolant fluid, the power device being operable to modify an electric current transmitted between the power source and the electrical load;

mounting a first casing segment of an outer casing of a vapor chamber to the module housing such that the first casing segment is fluidly sealed to the internal coolant chamber and exposed to the coolant fluid;

mounting an inboard casing surface of a second casing segment of the outer casing to an outboard surface of the power device; and mounting an outboard casing surface of the second casing segment of the outer casing to an inboard surface of the power device.

16. The method of claim 15, wherein the module housing further includes a plurality of housing walls, and wherein mounting the outer casing of the vapor chamber to the module housing includes connecting the housing walls with the vapor chamber to cooperatively define the internal coolant chamber.

17. The method of claim 16, wherein the housing walls include opposing first and second end walls, and wherein the outer casing of the vapor chamber extends between and adjoins at first and second ends thereof with the first and second end walls, respectively, such that the vapor chamber defines an outer wall of the module housing.

18. The method of claim 15, wherein the vapor chamber includes first and second vapor chambers, and the outer casing includes first and second outer casings of the first and second vapor chambers, respectively, and wherein mounting the outer casing to the module housing includes mounting the first casing segment of each of the first and second outer casings to the module housing such that the first casing segments are both fluidly sealed to the internal coolant chamber and exposed to the coolant fluid.

19. The method of claim 18, wherein the power device is a first power device, the inboard casing surface of the second casing segment of the first outer casing is mounted to the outboard surface of the first power device, and the outboard casing surface of the second casing segment of the second outer casing is mounted to the inboard surface of the first power device such that the first power device is sandwiched between the first and second vapor chambers.

20. The method of claim 15, wherein the vapor chamber further includes a working fluid, a support structure, and a fluid-wicking structure packaged inside the outer casing, and wherein the fluid-wicking structure defines a vapor core and is configured to draw the working fluid, when vaporized, from a hot side of the outer casing, through the vapor core, to a cold side of the casing, and draw the working fluid, when condensed at the cold side of the casing, back to the hot side of the outer casing.

* * * * *